United States Patent
Pugh et al.

(10) Patent No.: US 10,656,915 B2
(45) Date of Patent: May 19, 2020

(54) EFFICIENT FPGA MULTIPLIERS

(71) Applicant: Achronix Semiconductor Corporation, Santa Clara, CA (US)

(72) Inventors: Daniel Pugh, Los Gatos, CA (US); Raymond Nijssen, San Jose, CA (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 16/134,576

(22) Filed: Sep. 18, 2018

(65) Prior Publication Data
US 2020/0019375 A1    Jan. 16, 2020

Related U.S. Application Data

(60) Provisional application No. 62/697,847, filed on Jul. 13, 2018.

(51) Int. Cl.
*G06F 7/533*    (2006.01)
*H03K 19/17728*    (2020.01)

(52) U.S. Cl.
CPC ....... *G06F 7/533* (2013.01); *H03K 19/17728* (2013.01)

(58) Field of Classification Search
CPC ........ G06F 7/5057; G06F 7/523; G06F 7/527; G06F 7/53; G06F 7/533; G06F 1/03; H03K 19/17728
See application file for complete search history.

(56) References Cited

U.S. PATENT DOCUMENTS

| | | | |
|---|---|---|---|
| 7,119,575 B1 | 10/2006 | Schleicher et al. | |
| 7,218,139 B1* | 5/2007 | Young | H03K 19/1736 326/38 |
| 7,265,576 B1* | 9/2007 | Kondapalli | H03K 19/17728 326/38 |
| 7,385,416 B1* | 6/2008 | Chirania | H03K 19/17728 326/37 |
| 7,543,008 B1 | 6/2009 | Matula et al. | |
| 8,217,678 B1* | 7/2012 | Lewis | H03K 19/177 326/38 |

(Continued)

FOREIGN PATENT DOCUMENTS

CA    2149478    1/1996

OTHER PUBLICATIONS

"International Application Serial No. PCT US2019 038100, International Search Report dated Sep. 12, 2019", 2 pgs.

(Continued)

*Primary Examiner* — Matthew D Sandifer
(74) *Attorney, Agent, or Firm* — Schwegman Lundberg & Woessner, P.A.

(57) ABSTRACT

In some example embodiments a logical block comprising twelve inputs and two six-input lookup tables (LUTs) is provided, wherein four of the twelve inputs are provided as inputs to both of the six-input lookup tables. This configuration supports efficient field programmable gate array (FPGA) implementation of multipliers. Each six-input LUT comprises two five-input lookup tables (LUT5s) that are used to form Booth encoding multiplier building blocks. The five inputs to each LUT5 are two bits from a multiplier and three Booth-encoded bits from a multiplicand. By assembling building blocks, multipliers of arbitrary size may be formed.

20 Claims, 12 Drawing Sheets

(56) References Cited

U.S. PATENT DOCUMENTS

| | | | |
|---|---|---|---|
| 8,352,532 B1* | 1/2013 | Kostarnov | G06F 7/5324 |
| | | | 708/625 |
| 10,514,894 B2* | 12/2019 | Wang | G06F 7/588 |
| 2005/0080834 A1 | 4/2005 | Belluomini et al. | |
| 2013/0278289 A1* | 10/2013 | Jang | H03K 19/173 |
| | | | 326/38 |
| 2016/0246571 A1* | 8/2016 | Walters, III | G06F 7/5057 |
| 2016/0315619 A1* | 10/2016 | Fan | H03K 19/0008 |
| 2017/0222651 A1* | 8/2017 | Van Dyken | H03K 19/1737 |

OTHER PUBLICATIONS

"International Application Serial No. PCT US2019 038100, Written Opinion dated Sep. 12, 2019", 4 pgs.

* cited by examiner

EFFICIENT FPGA MULTIPLIERS

PRIORITY CLAIM

This application claims the benefit of priority to U.S. Provisional Patent Application Ser. No. 62/697,847, filed Jul. 13, 2018, and titled "Efficient FPGA Multipliers," which application is incorporated herein by reference in its entirety.

BACKGROUND

Field-programmable gate arrays (FPGAs) are integrated circuits customized after manufacture. An FPGA comprises an array of logic blocks comprising elements such as lookup tables (LUTs), adders, and flip-flops.

A multiplier circuit generates a product of two factors: the multiplicand and the multiplier.

BRIEF DESCRIPTION OF THE DRAWINGS

Some embodiments of the disclosed technology are illustrated by way of example and not limitation in the figures of the accompanying drawings.

DETAILED DESCRIPTION

Figure 1:
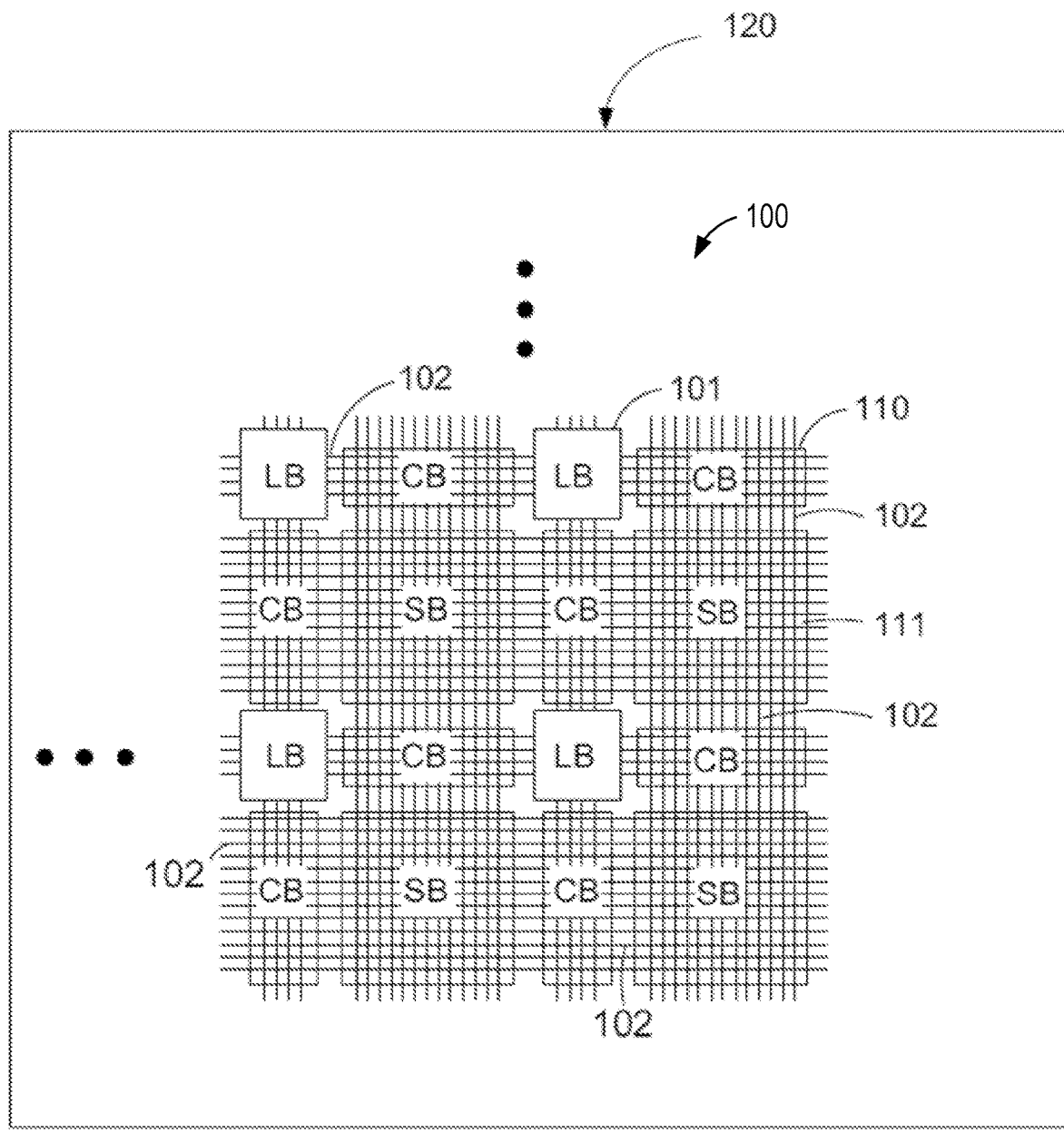
FIG. 1 is a diagrammatic view of an example circuit chip fabric, according to various embodiments of the invention.

Example methods, systems and circuits for efficient FPGA multipliers will now be described. In the following description, numerous examples having example-specific details are set forth to provide an understanding of example embodiments. It will be evident, however, to one of ordinary skill in the art that these examples may be practiced without these example-specific details, and/or with different combinations of the details than are given here. Thus, specific embodiments are given for the purpose of simplified explanation, and not limitation.

In radix-4 modified Booth encoding, a multiplicand is recoded two bits at a time using overlapping groups of three bits. A zero is post-pended to the right of bit zero. Thus, the first group of three bits is $\{x_1, x_0, 0\}$; the second group of three bits is $\{x_3, x_2, x_1\}$, and so on. Each group of three bits is recoded as a partial product of the multiplier and the partial products are summed to yield the product of the multiplier and the multiplicand. The multiplier and multiplicand are represented in two's-complement notation.

Table 1, below, refers to the multiplicand as B and the multiplier as A. The table shows the partial product for any of the above-referenced three-bit sequences of B. The size of B is N. The index J is an odd number from one to the size of B minus one, such that B[N−1] refers to the MSB of B, B[0] refers to the LSB of B, and B[−1] is an appended 0 bit.

TABLE 1

| B[J] | B[J − 1] | B[J − 2] | Partial Product | Comments |
|---|---|---|---|---|
| 0 | 0 | 0 | 0 | String of 0 s |
| 0 | 0 | 1 | +A | End of 1 s |
| 0 | 1 | 0 | +A | Single 1 |
| 0 | 1 | 1 | +2A | End of 1 s |
| 1 | 0 | 0 | −2A | Beginning of 1 s |
| 1 | 0 | 1 | −A | Single 0 |
| 1 | 1 | 0 | −A | Beginning of 1 s |
| 1 | 1 | 1 | −0 | String of 1 s |

Table 2, below, shows the bit-wise representation of each partial product. M is the size of A, such that A[M−1] refers to the MSB of A. The "Op" column indicates the value to be added to the partial product before combining the partial product with the other partial products to find the product. Inverted bits (used in the −A and −2A partial products) are indicated with a prime mark (e.g., A[M-1]').

TABLE 2

| | Partial Product | | | | | | | |
|---|---|---|---|---|---|---|---|---|
| | P[M] | P[M − 1] | P[M − 2] | ... | P[2] | P[1] | P[0] | Op |
| +0 | 0 | 0 | 0 | ... 0 | 0 | 0 | 0 | |
| +A | A[M − 1] | A[M − 1] | A[M − 2] | ... | A[2] | A[1] | A[0] | 0 |
| +2A | A[M − 1] | A[M − 2] | A[M − 3] | ... | A[1] | A[0] | 0 | 0 |
| −0 | 1 | 1 | 1 | ... 1 | 1 | 1 | 1 | 1 |
| −A | A[M − 1]' | A[M − 1]' | A[M − 2]' | ... | A[2]' | A[1]' | A[0]' | 1 |
| −2A | A[M − 1]' | A[M − 2]' | A[M − 3]' | ... | A[1] | A[0] | 1 | 1 |

The partial products are summed and given appropriate weights for the bit positions of the portions of B used to generate each partial product. Thus, since the bits of B used to generate each partial product shift by two, the results of each successive partial product will be shifted two bits to the left before summing. As a result, the first partial product will have M bits, the second will have M+2 bits, and so on. To perform the sum, the shorter partial products will be sign extended to be the same length as the longest partial product. In two's-complement notation, the MSB is 1 if the number is negative and 0 if the number is positive. Sign-extending a number duplicates the MSB for all added bits to the left of the MSB, thus avoiding changing either the value or the sign of the number.

The Booth encoding can be performed using LUTs. In some example embodiments, five-input LUTs (LUT5s) are used. The five inputs to each LUT5 are two bits from a multiplier and three Booth-encoded bits from a multiplicand. By assembling building blocks, each comprising a LUT5, multipliers of arbitrary size may be formed. By way of example, an eight-bit multiplier is described herein.

As discussed above, a partial product is generated for each two bits of B. Thus, for a B of size N, the number of partial products is $$\frac{N}{2}.$$

Each partial product uses M+1 LUT5s to generate the M+1 bits of each partial product shown in Table 2. If modified six-input LUTs (LUT6s) are used in place of LUT5s, one LUT6 can replace two LUT5s. Thus, $$\frac{M}{2} + 1 \ LUT6s$$

are used per row. As a result, $$\frac{(M+1) \times N}{4} \ LUT6s$$

are used to implement a multiplier for arbitrary values of M and N. The splitting of the LUT6 into two LUT5 sub-functions, along with efficient sharing of the inputs between pairs of LUT6 blocks, results in a significant improvement over prior art implementations.

In some example embodiments, this functionality is enabled through the use of a novel LUT6 design for use in an FPGA. A traditional LUT6 may be implemented using two LUT5s that take identical inputs. Disclosed herein is a novel LUT6 design in which an additional input is provided to the LUT6. In a first mode, the LUT6 operates as a traditional LUT6, with the same five inputs being provided to both LUT5s. In a second mode, the other additional input is used as an input to one of the LUT5s while the other LUT5 takes the standard inputs. Thus, in the second mode, only four of the five inputs to the two LUT5s are identical and the fifth may be different. The modified LUT6 provides two additional outputs: one for each LUT5. Accordingly, in the first mode, the standard output is used and in the second mode, the two LUT5 outputs are used. The mode is selected at the time of place and route of the FPGA.

Using the novel LUT6 design in a circuit chip fabric that allows the twelve inputs to two LUT6 blocks to be shared allows a 2×4 Booth multiplier building block to be built that efficiently makes use of the LUT6s without requiring additional logic blocks. This efficient packing of Booth multiplier building blocks provides a density advantage, allowing more multipliers to be built on a single chip. Additionally, since the novel LUT6 design can be configured as a traditional LUT6, existing place and route methodologies can be used to program FPGAs using the novel LUT6 in the traditional mode.

Support for arbitrary numbers of arbitrarily sized multipliers may be particularly useful in implementation of neural networks, which perform large numbers of multiplications in each layer. Since FPGAs are less expensive than processors and, using the methods described herein, a single FPGA can simultaneously perform many multiplication operations, use of the designs described herein may improve the rate at which neural networks can be trained, reduce the power costs associated with neural networks, or both.

By way of example and not limitation, this disclosure details the implementation of multiplication for two's complement (signed) numbers. Using the proposed sharing of the two LUT6 inputs, the same structure will support the multiplication of unsigned numbers. In some example embodiments, this is accomplished by placing a leading zero in front of the multiplier and multiplicand to force the two's complement circuitry to recognize the inputs as positive. Alternatively, for a more compact implementation, the LUT6 programming can be modified with the proposed input sharing to perform the unsigned multiplication more efficiently. Additionally, the interconnect amongst the 4×2 multiplier blocks is modified since the Baugh-Wooley sign extension method is not needed for unsigned numbers and sign extension is not necessary. This difference in interconnect is accomplished using the general-purpose routing in the FPGA.

Additionally, the support for unsigned multiplication can be converted to sign-magnitude format by unsigned multiplication on the two sign-magnitude numbers and using an additional LUTE to track the sign of the product by performing a logical XOR of the multiplier and multiplicand sign bits.

FIG. 1 is a diagrammatic view of an example circuit chip fabric 100, according to various embodiments of the invention. The fabric 100 contains programmable arrays of logic blocks 101 that support a variety of programmable logic functions. Routing tracks 102 in the fabric 100, illustrated as a plurality of orthogonally oriented tracks, are used to carry electronic signals and implement reconfigurable interconnections between the logic blocks 101. The major elements of a flexible routing architecture used to interconnect the routing tracks and configure the logic blocks include connection boxes 110 and switch boxes 111.

In implementation, the switch boxes 111 can be switches that connect wires to wires (e.g., the wires in the horizontal and vertical routing tracks: wires in horizontal tracks to wires in horizontal tracks, wires in vertical tracks to wires in vertical tracks, and wires in horizontal tracks to wires in vertical tracks). The connection boxes 110 can be switches that connect wires in horizontal and/or vertical tracks to the logic block 101 elements. For purposes of illustration, only exemplary elements in the drawing figure have been marked. However, a person of ordinary skill in the art will understand that the routing tracks 102, the connection boxes 110, and the switch boxes 111 can, in practice, be replicated over the surface of a semiconductor chip in order to provide the desired interconnection functionality.

The structure of the connection boxes 110 and the switch boxes 111 determine the connections of the routing tracks 102 to the logic blocks 101, thereby determining the functionality of a semiconductor chip 120 that includes them. For example, a semiconductor chip 120 that includes the fabric 100 may be fabricated as an FPGA, such as the type available from Achronix™, Xilinx™, Altera™ and other vendors.

In some example embodiments, each logic block includes LUTs, an arithmetic chain, and optional registers. Through the use of the novel LUT configurations described herein, the number of LUTs used to implement multiplication may be reduced. As a result, less area is used by logic blocks implementing a multiplication function. As a further result, since less area is used, the propagation time between the involved logic blocks is reduced, which reduces the time taken to complete a multiplication. Additionally, the use of fewer logic blocks per multiplier consumes less power, allows more multipliers to be placed on a single FPGA chip, or both.

Figure 2:
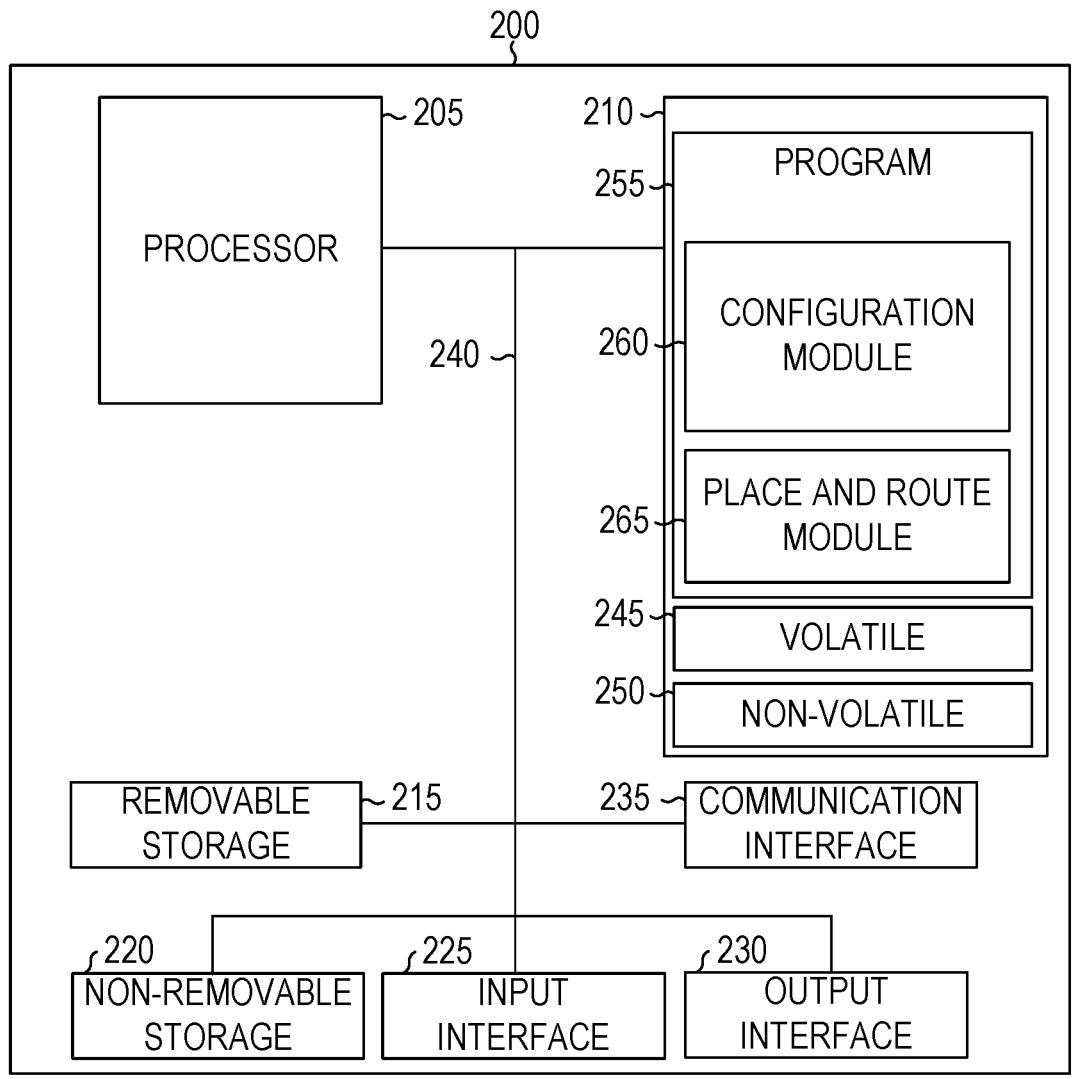
FIG. 2 is a block diagram illustrating components of a system that programs an FPGA, according to some example embodiments.

FIG. 2 is a block diagram illustrating components of a computer 200 that programs an FPGA, according to some example embodiments. All components need not be used in various embodiments. For example, clients, servers, autonomous systems, and cloud-based network resources may each use a different set of components, or, in the case of servers for example, larger storage devices.

One example computing device in the form of a computer 200 (also referred to as computing device 200 and computer system 200) may include a processor 205, memory storage 210, removable storage 215, and non-removable storage 220, all connected by a bus 240. Although the example computing device is illustrated and described as the computer 200, the computing device may be in different forms in different embodiments. For example, the computing device may instead be a smartphone, a tablet, a smartwatch, or another computing device including elements the same as or similar to those illustrated and described with regard to FIG. 2. Devices such as smartphones, tablets, and smartwatches are collectively referred to as "mobile devices." Further, although the various data storage elements are illustrated as part of the computer 200, the storage may also or alternatively include cloud-based storage accessible via a network, such as the Internet, or server-based storage.

The memory storage 210 may include volatile memory 245 and non-volatile memory 250, and may store a program 255. The computer 200 may include, or have access to, a computing environment that includes, a variety of computer-readable media, such as the volatile memory 245; the non-volatile memory 250; the removable storage 215; and the non-removable storage 220. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 200 may include or have access to a computing environment that includes an input interface 225, an output interface 230, and a communication interface 235. The output interface 230 may interface to or include a display device, such as a touchscreen, that also may serve as an input device. The input interface 225 may interface to or include one or more of a touchscreen, a touchpad, a mouse, a keyboard, a camera, one or more device-specific buttons, one or more sensors integrated within or coupled via wired or wireless data connections to the computer 200, and other input devices. The computer 200 may operate in a networked environment using the communication interface 235 to connect to one or more remote computers, such as database servers. The remote computer may include a personal computer (PC), server, router, network PC, peer device or other common network node, or the like. The communication interface 235 may connect to a local-area network (LAN), a wide-area network (WAN), a cellular network, a WiFi network, a Bluetooth network, or other networks.

Computer instructions stored on a computer-readable medium (e.g., the program 255 stored in the memory storage 210) are executable by the processor 205 of the computer 200. A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 255 is shown as including a configuration module 260 and a place and route module 265. Any one or more of the modules described herein may be implemented using hardware (e.g., a processor of a machine, an application-specific integrated circuit (ASIC), an FPGA, or any suitable combination thereof). Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

The configuration module 260 provides a user interface to allow a user to provide a configuration for an FPGA. For example, the user interface may allow the user to identify a hardware design language (HDL) file that specifies the configuration.

The place and route module 265 programs the FPGA based on the configuration. For example, the connection boxes 110, the switch boxes 111, and the routing tracks 102 may be configured. As another example, the connections to and from LUTs, as well as their contents (i.e., the particular output generated for each combination of inputs), may be configured.

Figure 3:
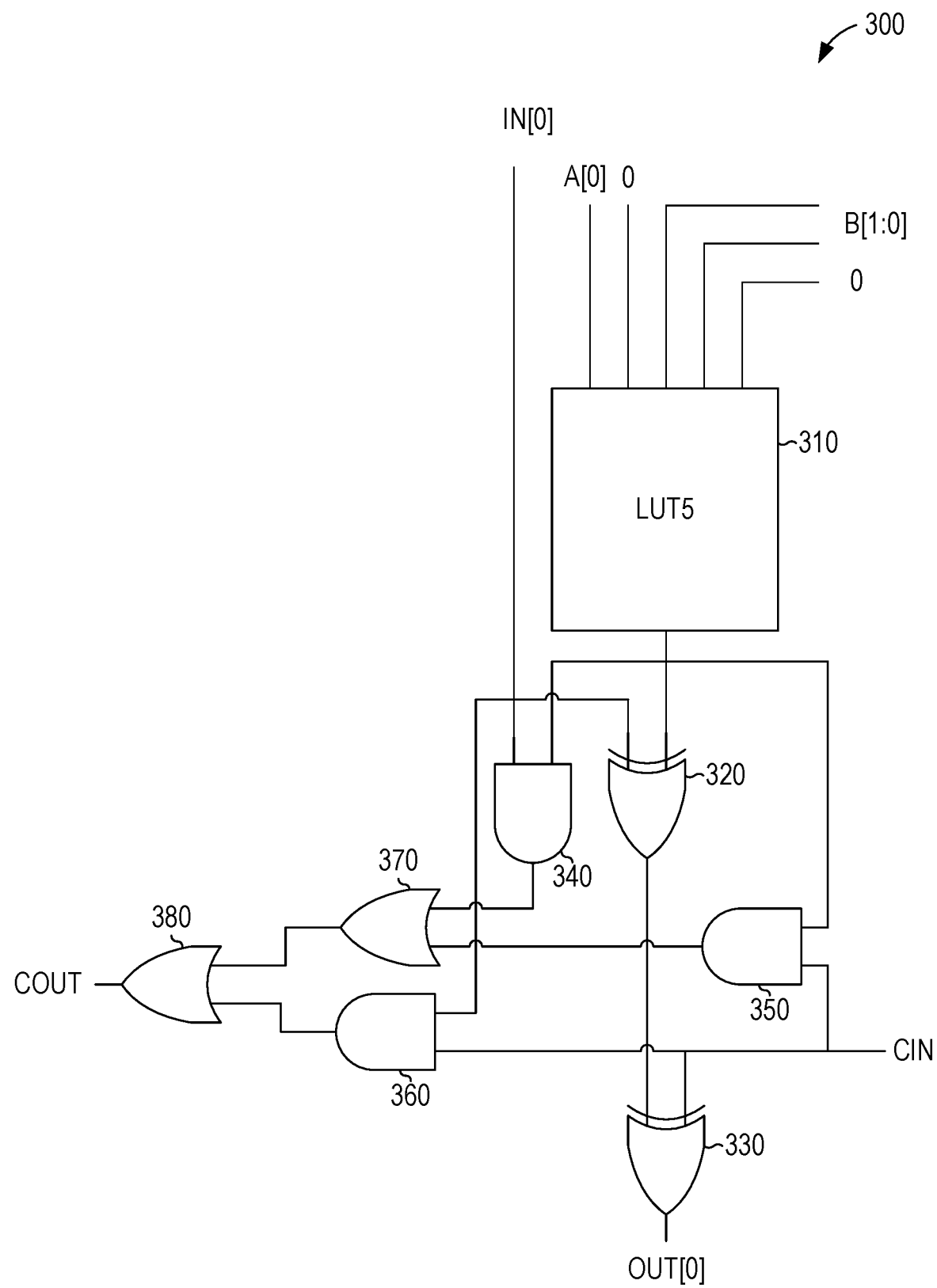
FIG. 3 is a diagrammatic view of a least significant bit (LSB) Booth multiplier building block, according to various embodiments of the invention.

FIG. 3 is a diagrammatic view of an LSB Booth multiplier building block 300, according to various embodiments of the invention. The LSB Booth multiplier building block 300 comprises a LUT5 310, exclusive OR (XOR) gates 320 and 330, AND gates 340, 350, and 360, and OR gates 370 and 380. The two factors are referred to as A and B, with individual bits within each factor indicated by a number in brackets. Bit 0 is the LSB. Multiple bits within a factor are indicated as a range. For example, B[1:0] represents the two least significant bits of multiplicand B. Similarly, the LSB Booth multiplier building block 300 may receive a sum input, IN[0], from a previous row of a larger multiplier structure. If there is no previous row, IN[0] may be set to 0. The LSB Booth multiplier building block 300 may receive a carry input, CIN, from a building block to the right. If there is no building block to the right, as is typically the case for an LSB building block, CIN may be set to 0. The LSB Booth multiplier building block 300 generates two outputs: the LSB of a sum output, OUT[0], and a carry output, COUT.

The LUT5 310 takes the LSB of A and the two least significant bits of B as inputs, along with two 0 s. The five input bits generate a 1-bit output. The gates 320-380 together form an adder that adds IN[0], the output of the LUT5 310, and CIN. The adder formed by the gates 320-380 is a ripple adder, but other types of adders are used in other example embodiments. For example, a ripple carry adder, a carry-look-ahead adder, or a carry-save-adder could be used instead. COUT contains the high bit of the adder result and OUT[0] contains the low bit of the adder result. Thus, in the special case that IN[0] and CIN are both zero, COUT will be zero and OUT[0] will be the result from the LUT5. Below is a table that shows the 1-bit output of the LUT5 for any combination of A and B inputs.

| A[I] | A[I − 1] | B[J] | B[J − 1] | B[J − 2] | RESULT |
|------|----------|------|----------|----------|--------|
| ANY  | ANY      | 0    | 0        | 0        | 0      |
| 0    | ANY      | 0    | 0        | 1        | 0      |
| 1    | ANY      | 0    | 0        | 1        | 1      |
| 0    | ANY      | 0    | 1        | 0        | 0      |
| 1    | ANY      | 0    | 1        | 0        | 1      |
| ANY  | 0        | 0    | 1        | 1        | 0      |
| ANY  | 1        | 0    | 1        | 1        | 1      |
| ANY  | 0        | 1    | 0        | 0        | 1      |
| ANY  | 1        | 1    | 0        | 0        | 0      |
| 0    | ANY      | 1    | 0        | 1        | 1      |
| 1    | ANY      | 1    | 0        | 1        | 0      |
| 0    | ANY      | 1    | 1        | 0        | 1      |
| 1    | ANY      | 1    | 1        | 0        | 0      |
| ANY  | ANY      | 1    | 1        | 1        | 1      |

Figure 4:
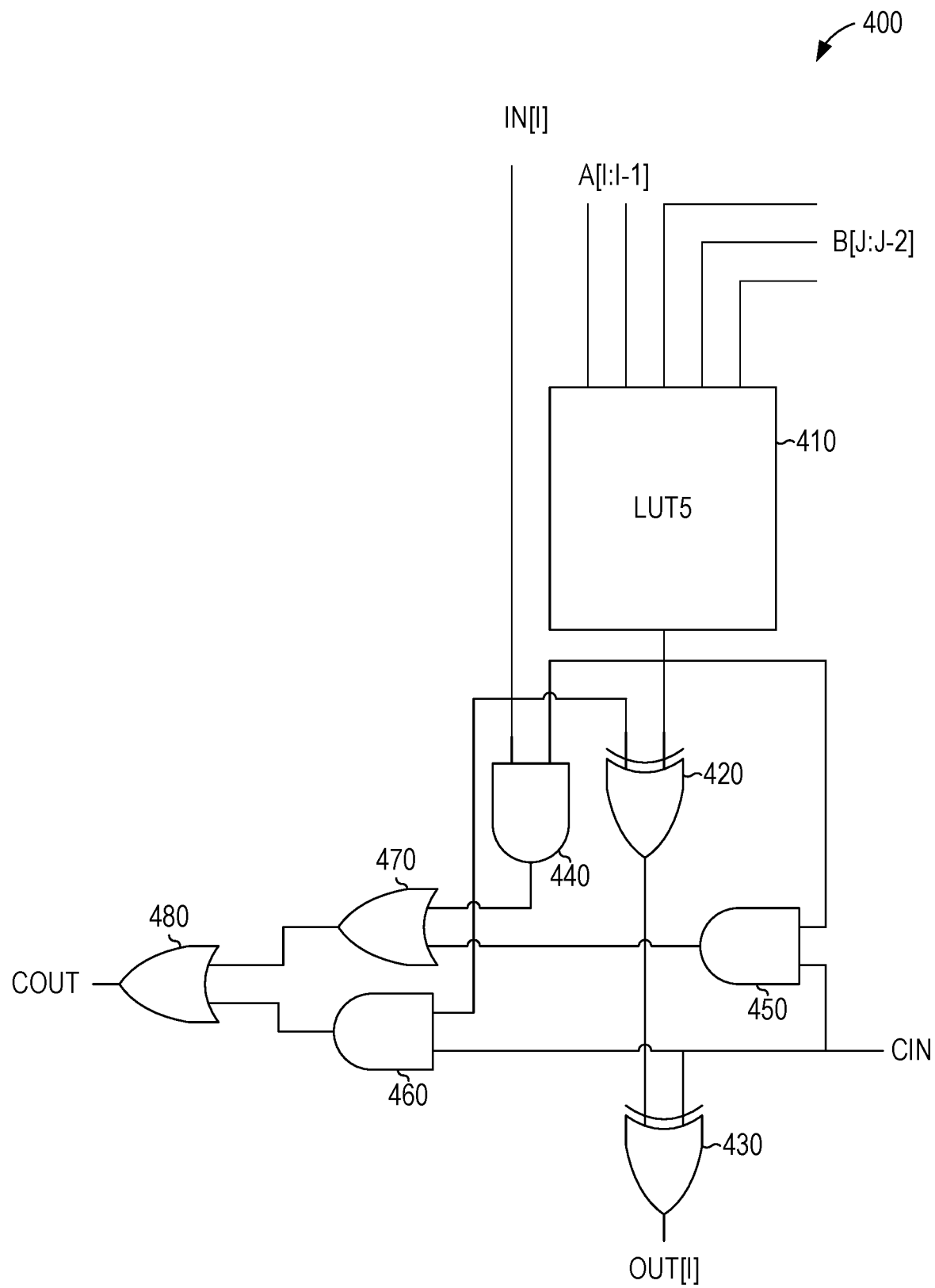
FIG. 4 is a diagrammatic view of a Booth multiplier building block, according to various embodiments of the invention.

FIG. 4 is a diagrammatic view of a Booth multiplier building block 400, according to various embodiments of the invention. The Booth multiplier building block 400 comprises a LUT5 410, XOR gates 420 and 430, AND gates 440, 450, and 460, and OR gates 470 and 480. The Booth multiplier building block 400 is the same as the LSB Booth multiplier building block 300, generalized to handle other portions of the factors. The inputs to the LUT5 410 are A[I:I-1] and B[J:J-2], wherein I is any value from 0 to the MSB of A and J is any odd value from 1 to the MSB of B. If the size of B is odd (i.e., the index to the MSB of B is even), B may be sign-extended by one bit prior to performing the multiplication. Both A[−1] and B[−1] are treated as a zero.

Figure 5:
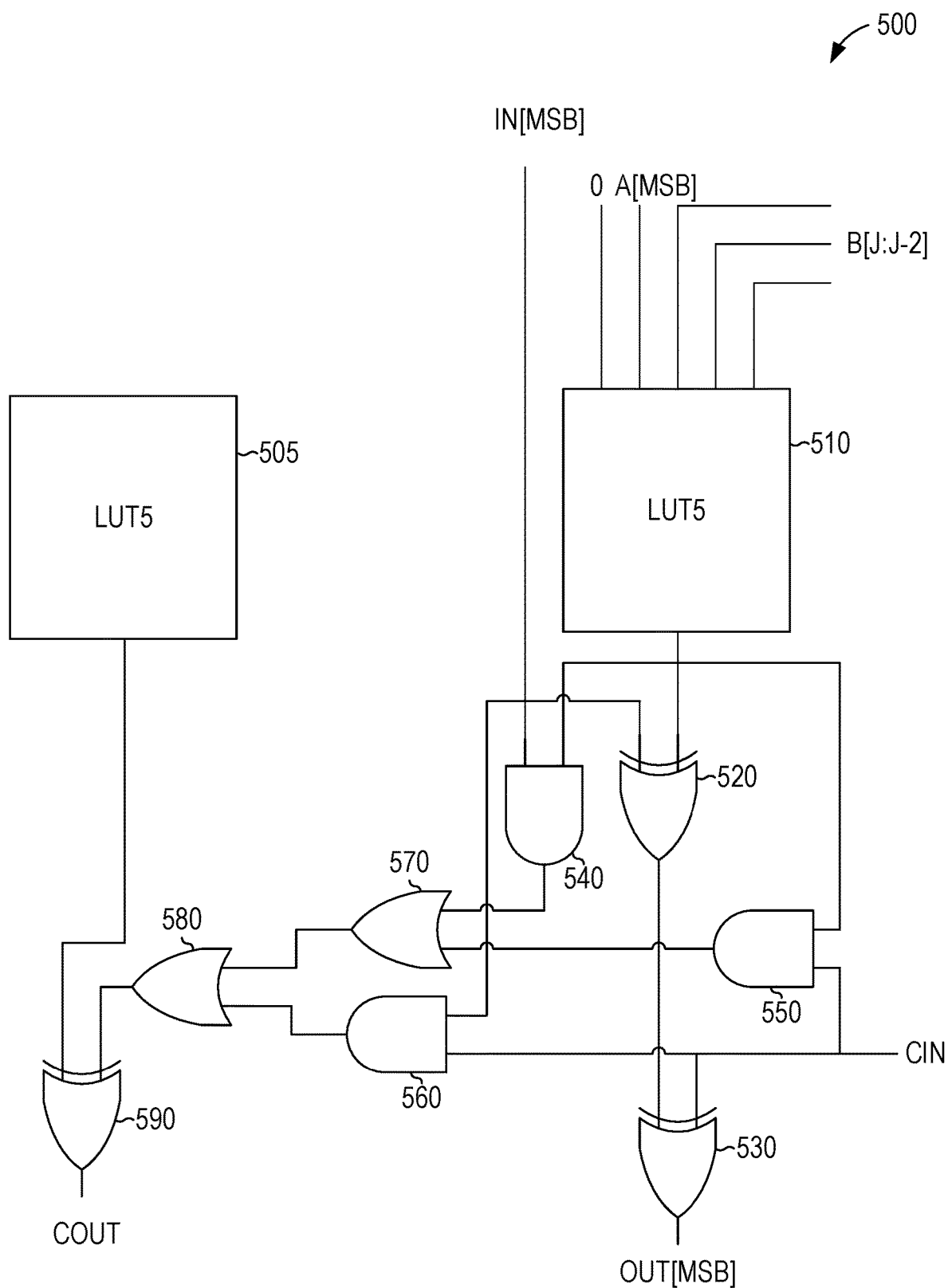
FIG. 5 is a diagrammatic view of a most significant bit (MSB) Booth multiplier building block, according to various embodiments of the invention.

FIG. 5 is a diagrammatic view of an MSB Booth multiplier building block 500, according to various embodiments of the invention. The Booth multiplier building block 500 comprises a LUT5 505, a LUT5 510, XOR gates 520, 530, and 590, AND gates 540, 550, and 560, and OR gates 570 and 580. The MSB Booth multiplier building block 500 is the same as the Booth multiplier building block 400, with the modification of the addition of the LUT5 505 and the XOR gate 590. The inputs to the LUT5 510 are A[MSB], prepended with a 0, and B[J:J-2].

The LUT5 505 is configured to provide a 1 as output regardless of the input. Accordingly, the input to the LUT5 505 may be connected to any convenient source; for example, the LUT5 505 may use the same inputs as the LUT5 510. The XOR gate 590 takes one input from the LUT5 505 and one input from the OR gate 580. Since the input from the LUT5 505 is always 1, the COUT output from the XOR gate 590 is the inverse of the output of the OR gate 580. Using the LUT5 505 to generate a 1 output allows the modified LUT6 1000 of FIG. 10, described below, to be used to implement both LUT5 505 and LUT5 510.

Figure 6:
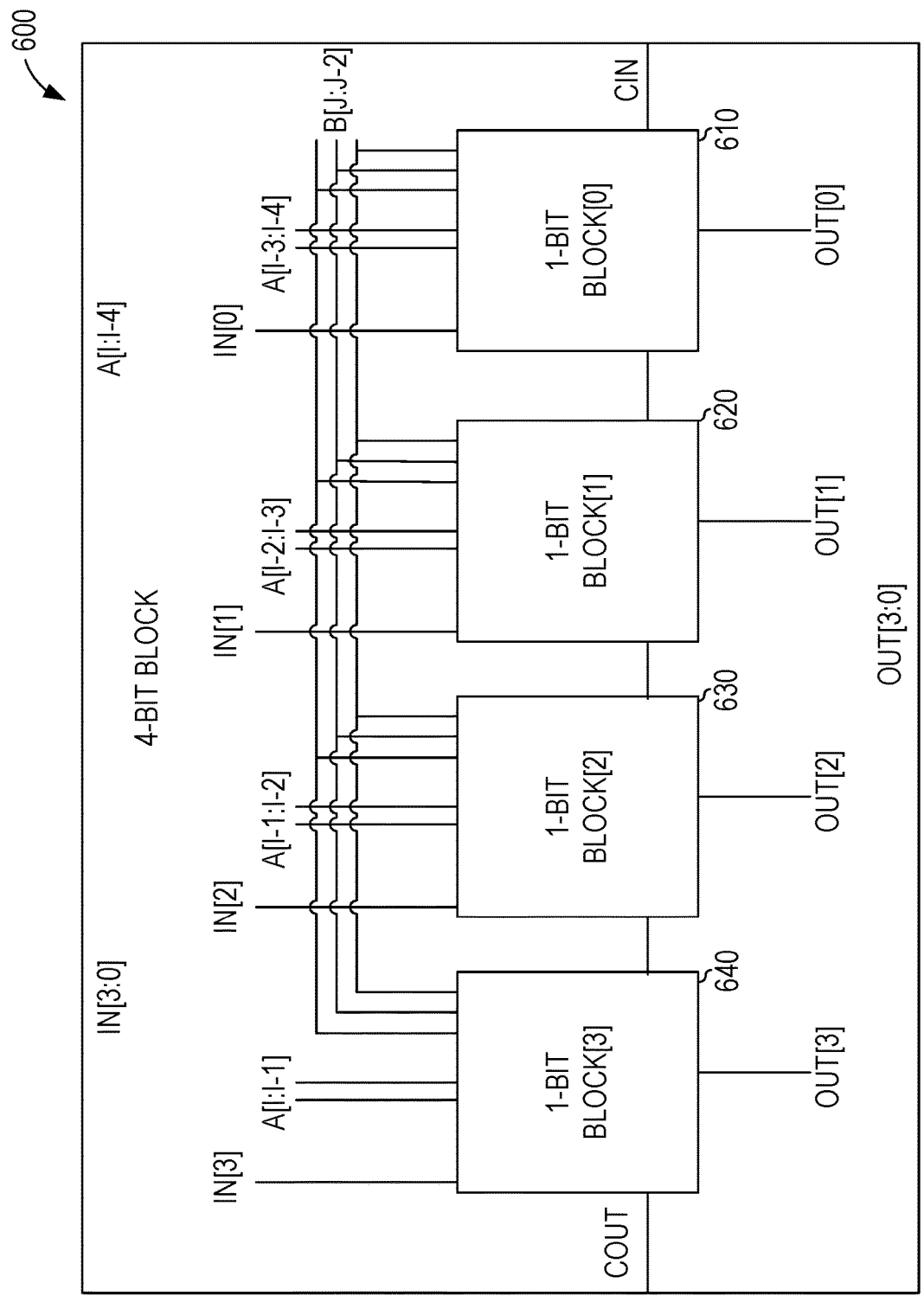
FIG. 6 is a diagrammatic view of a 4-bit Booth multiplier building block, according to various embodiments of the invention.

FIG. 6 is a diagrammatic view of a 4-bit Booth multiplier building block 600, according to various embodiments of the invention. The 4-bit Booth multiplier building block 600 includes four 1-bit building blocks 610, 620, 630, and 640, which may be instantiations of the Booth multiplier building block 400. The 4-bit Booth multiplier building block 600 receives a 4-bit sum input (IN) from a previous row, a 5-bit A input, a 3-bit Booth encoded B input, and a 1-bit CIN connected to the COUT of a Booth multiplier building block to the right. IN is set to zero if there is no previous row. CIN is set to zero if there is no Booth multiplier building block to the right. The portion of A handled by the 4-bit Booth multiplier building block 600 is indicated by the index I, which is one less than a multiple of 4 (e.g., 3, 7, 11, 15, and so on). For the special case that I is 3, the input bits for A are A[3:−1], and the input should provide a zero for A[−1]. The portion of B handled by the 4-bit Booth multiplier building block 600 is indicated by the index J, which is an odd number. For the special case that J is 1, the input bits for B are B[1:−1], and the input should provide a zero for B[−1].

Each 1-bit building block 610-640 takes two A bits and three B bits as inputs to a LUT5, one bit of IN as the sum input from the previous row, and a 1-bit carry input. Each 1-bit building block 610-640 generates one output bit for the result and one carry output bit. The carry output bit of each block is connected to the carry input of the next block to the left; the carry output bit of the left-most block is the carry output value for the 4-bit Booth multiplier building block 600.

Figure 9:
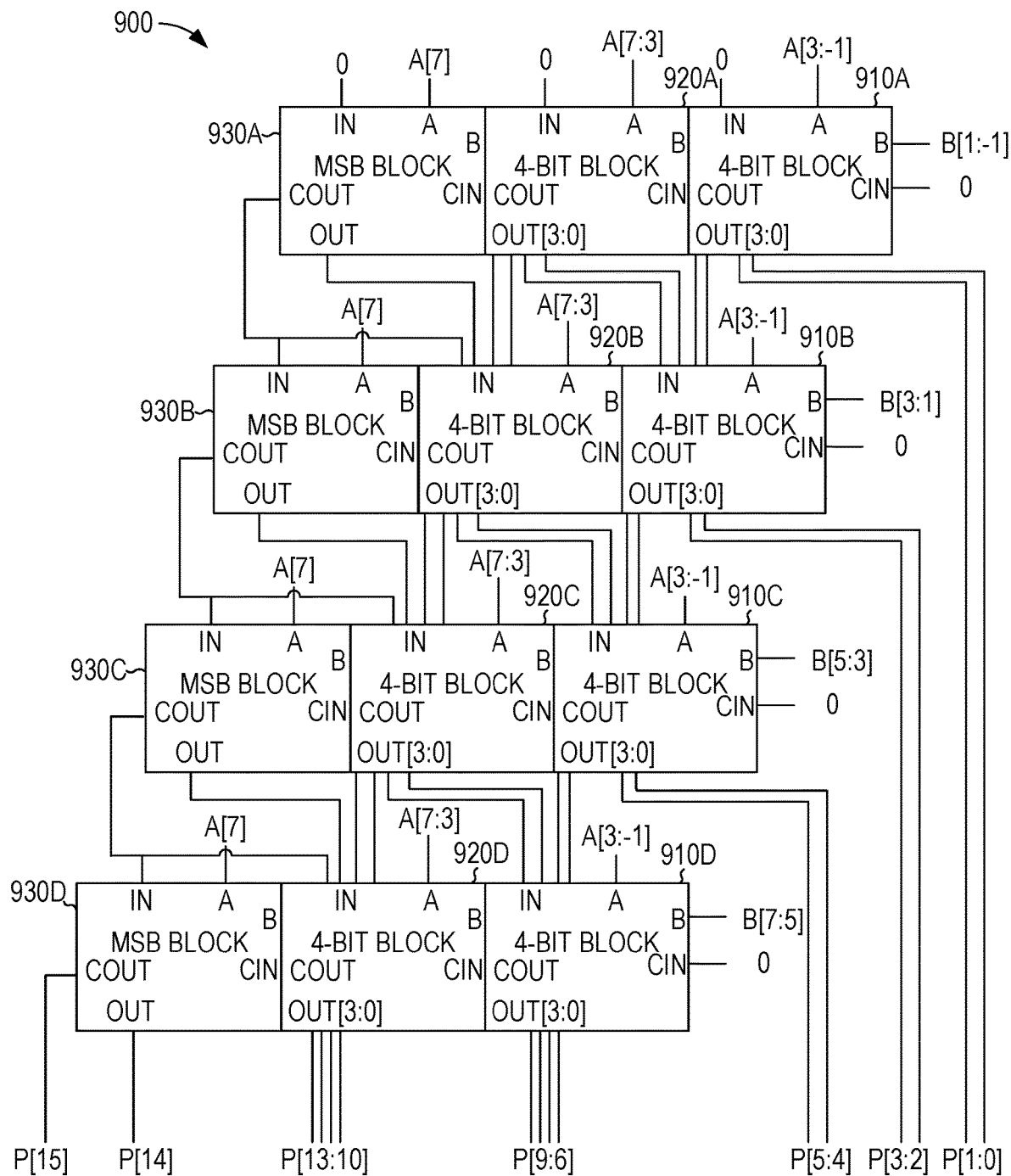
FIG. 9 is a diagrammatic view of an 8-bit multiplier using MSB Booth multiplier building blocks and 4-bit Booth multiplier building blocks, according to various embodiments of the invention.

Taken as a block standing alone (i.e., with IN and CIN set to zero), the 4-bit Booth multiplier building block 600 takes four bits of A and three Booth-encoded bits of B as inputs and generates a five-bit partial product, considering COUT as the MSB. In combination with other Booth multiplier building blocks, as seen in FIG. 9, the 4-bit Booth multiplier building block 600 may be used to create multipliers of arbitrary size in an FPGA.

Figure 7:
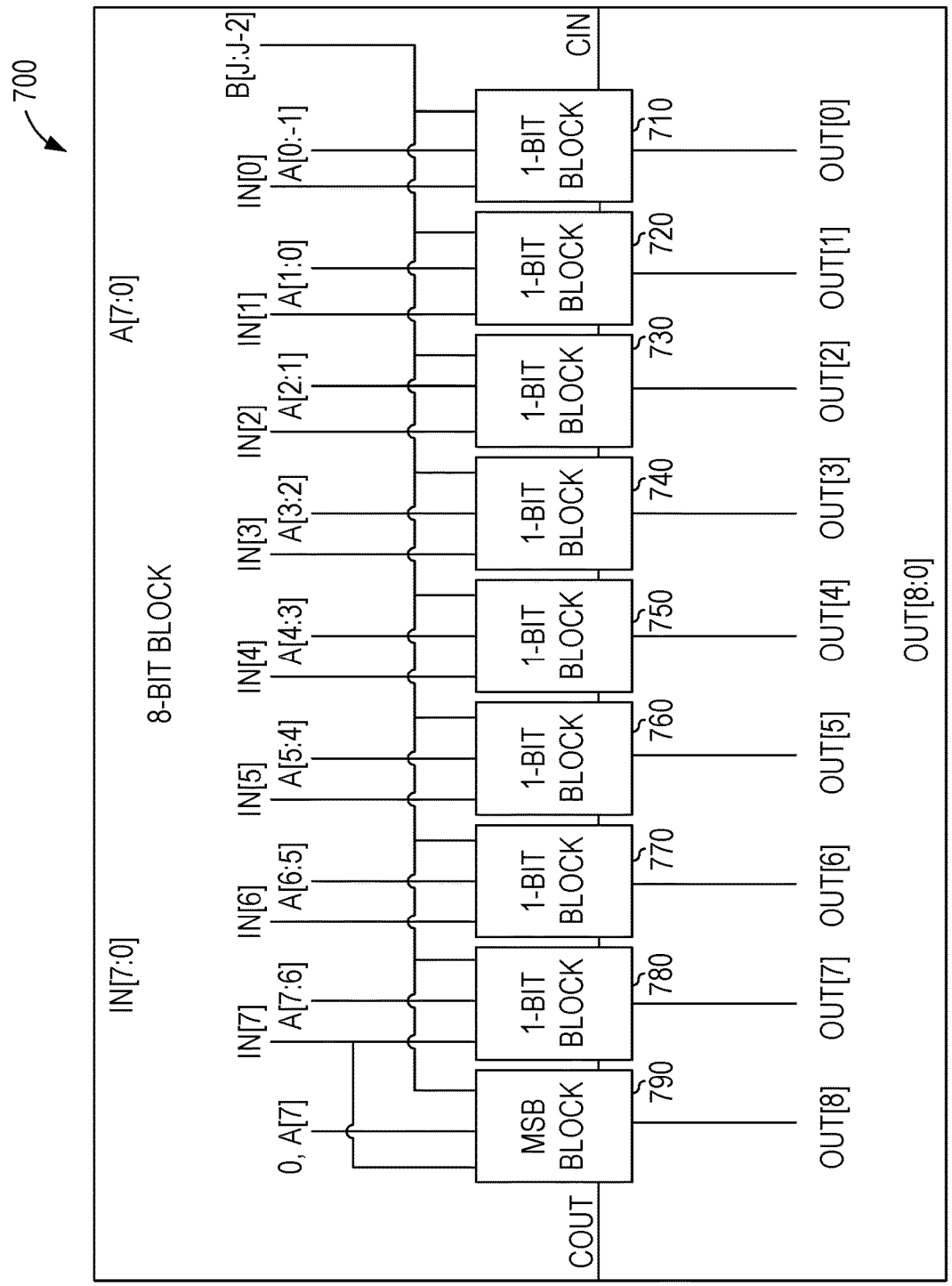
FIG. 7 is a diagrammatic view of an 8-bit Booth multiplier building block, according to various embodiments of the invention.

FIG. 7 is a diagrammatic view of an 8-bit Booth multiplier building block 700, according to various embodiments of the invention. The 8-bit Booth multiplier building block 700 includes 1-bit Booth multiplier building blocks 710, 720, 730, 740, 750, 760, 770, and 780 as well as MSB Booth multiplier building block 790. The inputs to the 8-bit Booth multiplier building block 700 include an 8-bit A input (A[7:0]), a three bit Booth-encoded B input (B[J:J-2]), an 8-bit sum (IN) from a previous row, and a 1-bit carry input (CIN) from a building block to the right. IN and CIN are set to zero if the 8-bit Booth multiplier building block 700 is the first row or the right-most building block, respectively. The A and IN inputs are divided and provided to the 1-bit Booth multiplier building blocks 710-780 as shown in FIG. 7 and described below. The 8-bit Booth-encoded multiplier building block 700 generates an eight-bit output (OUT) and a 1-bit carry output (COUT).

Each 1-bit Booth multiplier building block 710-780 takes two of the A bits and the three Booth-encoded B bits as inputs to a LUT5, one of the IN bits from the previous row (set to 0 if there is no previous row), and a 1-bit carry input (set to CIN for the right-most 1-bit Booth multiplier building block 710). Each 1-bit Booth multiplier building block 710-780 generates one output bit for the result and one carry output bit. The carry output bit of each 1-bit block 710-780 is connected to the carry input of the next block to the left. In some example embodiments, each 1-bit Booth multiplier building block 710-780 has the same structure (e.g., the structure of the 1-bit Booth multiplier building block 400).

The MSB Booth multiplier building block 790 takes the MSB of A, prepended with a zero as the A input, and takes the same three Booth-encoded bits as the other building blocks as the B input. For the 1-bit sum input from the previous row, the IN bit used as the input for the 1-bit Booth multiplier building block 780 is duplicated. The carry input for the MSB Booth multiplier building block 790 is the carry output of the 1-bit Booth multiplier building block 780; the carry output bit of the MSB Booth multiplier block is the carry output (COUT) value for the 8-bit Booth multiplier building block 700.

Taken as a stand alone block (i.e., with IN and CIN set to zero), the 8-bit Booth multiplier building block 700 takes eight bits of A and three Booth-encoded bits of B as inputs and generates a nine-bit partial product, considering COUT as the MSB. In combination with other Booth multiplier building blocks, as seen in FIG. 8, the 8-bit Booth multiplier building block 700 may be used to create an 8-bit multiplier.

Figure 8:
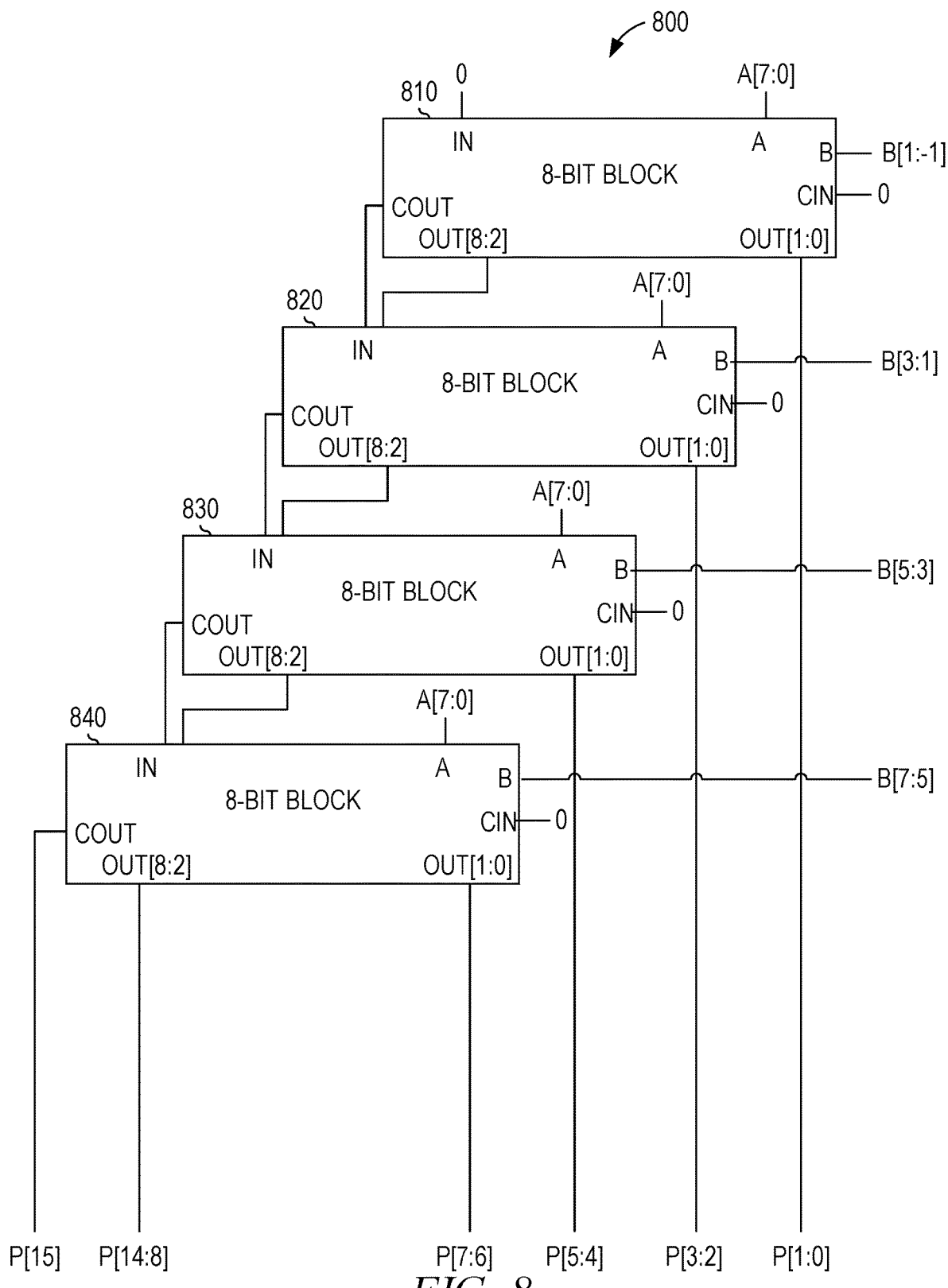
FIG. 8 is a diagrammatic view of an 8-bit multiplier using 8-bit Booth multiplier building blocks, according to various embodiments of the invention.

FIG. 8 is a diagrammatic view of an 8-bit multiplier 800 using 8-bit Booth multiplier building blocks, according to various embodiments of the invention. The 8-bit multiplier 800 includes 8-bit Booth multiplier building blocks 810, 820, 830, and 840. Each of the 8-bit Booth multiplier building blocks 810-840 may be an instance of the 8-bit Booth multiplier building block 700.

Each 8-bit Booth multiplier building block 810-840 takes all eight bits of A (A[7:0]) as an input and provides them as pairwise inputs to the nine component blocks 710-790 shown in FIG. 7. The first 8-bit Booth multiplier building block 810 takes the first two bits of B and a padding zero as the B input, indicated as B[1:−1]. The second 8-bit Booth multiplier building block 820 takes the next two bits of B and an overlapping bit, indicated as B[3:1]. This pattern is repeated, with the 8-bit Booth multiplier building block 830 taking B[5:3] as the B input and the 8-bit Booth multiplier building block 840 taking B[7:5] as the B input. Stated another way, and with reference to FIG. 7, J is 1 for the 8-bit Booth multiplier building block 810, J is 3 for the 8-bit Booth multiplier building block 820, J is 5 for the 8-bit Booth multiplier building block 830, and J is 7 for the 8-bit Booth multiplier building block 840.

The carry input value provided to the each 8-bit Booth multiplier building block 810-840 is zero, since there is no building block to the right. The IN value provided to the 8-bit Booth multiplier building block 810 is zero, since there is no building block above, but the IN value provided to each 8-bit Booth multiplier building block 820-840 is taken from the output of the previous 8-bit Booth multiplier building block 810-830, respectively.

As can be seen in FIG. 8, the 8-bit IN value is composed of the COUT bit from the previous block and the high seven bits of the OUT value from the previous block. Thus, the COUT value is treated as the MSB of a 10-bit output. The 8-bit multiplier 800 generates a 16-bit product, P. Each of the 8-bit Booth multiplier building blocks 810-830 directly computes two bits of P. The 8-bit Booth multiplier building block 840 computes the remaining ten bits of P.

Using the 8-bit Booth multiplier building blocks, larger multipliers that multiply 8-bit A values by larger B values may be formed. For each two bits increase in the size of B, an additional 8-bit Booth multiplier building block is added and the size of P increases by two bits. Thus, five 8-bit Booth multiplier building blocks may be used to form an 8-bit by 10-bit multiplier that provides an 18-bit output, eight 8-bit Booth multiplier building blocks may be used to form an 8-bit by 16-bit multiplier that provides a 24-bit output, and so on.

FIG. 9 is a diagrammatic view of an 8-bit multiplier 900 using MSB Booth multiplier building blocks 930A, 930B, 930C, and 930D, and 4-bit Booth multiplier building blocks 910A, 910B, 910C, 910D, 920A, 920B, 920C, and 920D. The 8-bit multiplier 900 multiplies an 8-bit A value by an 8-bit B value to generate a 16-bit product (P) result. The 8-bit multiplier 900 includes four rows of Booth multiplier building blocks, one row for each two bits of multiplicand B. Each row includes two 4-bit Booth multiplier building blocks, one for each four bits of multiplier A. Each row also includes one MSB Booth multiplier building block. Thus, while FIG. 9 shows an 8-bit multiplier, larger multipliers may be formed by adding one additional row for each two additional bits of the size of B and adding one additional 4-bit Booth multiplier building block to each row for each four additional bits of the size of A.

The first row of the 8-bit multiplier 900 comprises the 4-bit Booth multiplier building blocks 910A and 920A and the MSB Booth multiplier building block 930A. The building blocks 910A-930A take different parts of A as input, but all receive the first two bits of B (plus an appended zero, noted as B[−1]). Since the first row has no preceding row, the IN value is set to zero. The CIN value of the right-most 4-bit Booth multiplier building block 910A is set to zero, and the COUT value of each 4-bit Booth multiplier building block 910A-920A is used as the CIN value of the building block 920A-920B to the left.

The low two bits of the output from the right-most 4-bit Booth multiplier building block 910A are used as the low two bits of P. The high two bits of the output from the 4-bit Booth multiplier building block 910A are combined with the low two bits of the output from the 4-bit Booth multiplier building block 920A to provide the IN value to the 4-bit Booth multiplier building block 910B in the next row. The high two bits of the output from the 4-bit Booth multiplier building block 920A are combined with the output and COUT values from the MSB multiplier building block 930A to provide the IN value to the 4-bit Booth multiplier building block 920B in the next row. The COUT value from the MSB multiplier building block 930A is also provided as the IN value to the MSB multiplier building block 930B in the next row.

The second row operates similarly to the first, except that the IN value is as described above instead of being set to zero and the B input is B[3:1] instead of B[1:−1]. The two low bits of the output from the 4-bit Booth multiplier building block 910B are used as the next two bits of P, and the remainder of the output are fed into the third row as the IN values.

The third row operates similarly to the second, with the IN values taken from the output of the previous row and the B input now being B[5:3]. The two low bits of the output from the 4-bit Booth multiplier building block 910C are used as the next two bits of P, and the remainder of the output are fed into the fourth row as the IN values.

The fourth row operates similarly to the second and third, with the IN values taken from the output of the previous row and the B input now being B[7:5]. The four bits of the output from the right-most 4-bit Booth multiplier building block 910D are used as the next four bits of P. The four bits of the output from the 4-bit Booth multiplier building block 920D are used as the four bits of P after that. The COUT and OUT bits from the MSB multiplier building block 930D are used as the high two bits of P. In combination with the six bits of P provided by the previous row, the final result is a sixteen bit product of A and B.

Figure 10:
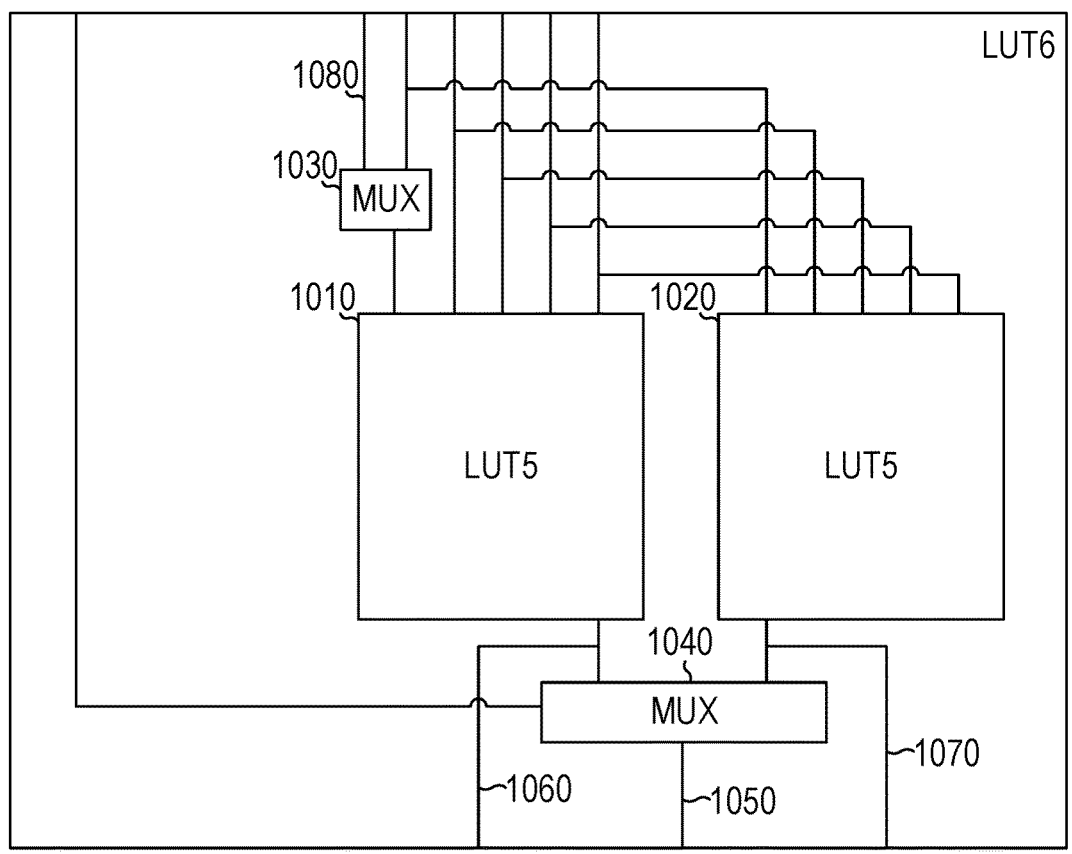
FIG. 10 is a diagrammatic view of a modified 6-bit LUT, according to various embodiments of the invention.

FIG. 10 is a diagrammatic view of a modified 6-bit LUT (LUT6) 1000, according to various embodiments of the invention. The LUT6 1000 comprises LUT5 1010, LUT5 1020, multiplexer (MUX) 1030, and MUX 1040. The output of the LUT6 is provided on output 1050. Additional LUT5 outputs 1060 and 1070 are provided. In addition to the standard six inputs to a standard LUT6, the LUT6 1000 includes an input 1080. The LUT6 1000 is configured during place and route of the FPGA including the LUT6 1000 as either a traditional LUT6 or as a pair of related LUT5s. If the LUT6 1000 is configured as a traditional LUT6, the output of the MUX 1030 to the LUT5 1010 is the standard fifth input, so the five inputs to the LUT5 1010 and the LUT5 1020 are the same. If the LUT6 1000 is configured as a pair of related LUT5s, the output of the MUX 1030 to the LUT5 1010 is the input 1080, and the LUT5 1010 and the LUT5 1020 only have four inputs in common.

When the LUT6 1000 operates as a standard LUT6, the output of the MUX 1040 is the value of the input to the MUX 1040 from the standard LUT6 input. As a result, five of the six inputs are provided to both LUT5s 1010, 1020. The output of each LUT5 1010, 1020 is provided as input to the MUX 1040. The output of the MUX 1040 is selected based on the sixth input to the LUT6 1000. The 1-bit output of the LUT6 1000 is provided on the output 1050.

When the LUT6 1000 operates as two LUT5s, the input 1080 is provided as one of the five inputs to the LUT5 1010. Thus, the inputs to the LUT5 1010 may be different than the inputs to the LUT5 1020. The individual outputs of the two LUT5s 1010 and 1020 are accessed via the output 1060, providing the output of the LUT5 1010, and the output 1070, providing the output of the LUT5 1020. Thus, the LUT6 block 1000 is designed such that it can be configured to behave as a traditional LUT6 or configured as a pair of related LUT5s to support efficient multiplier building blocks.

Figure 11:
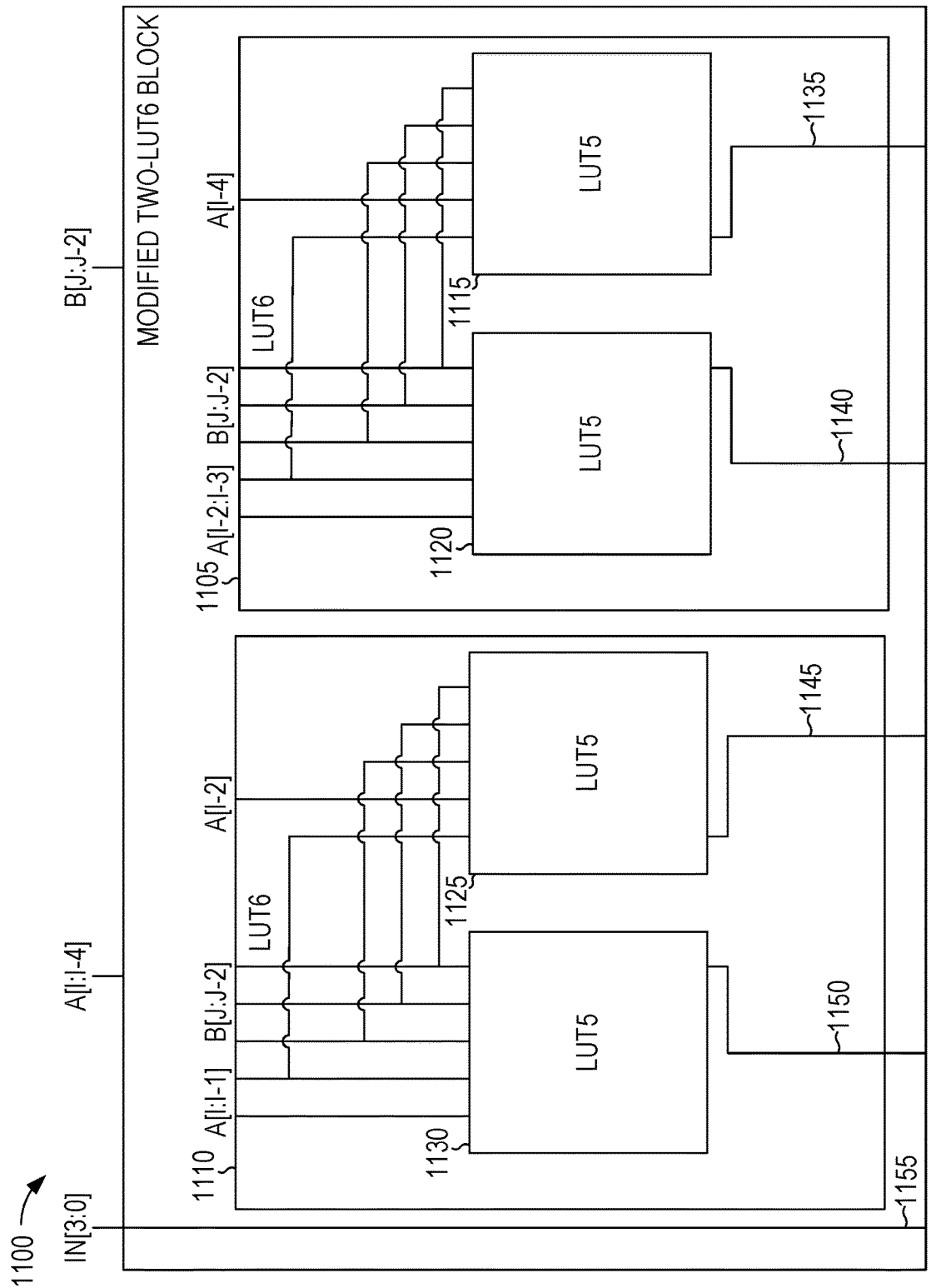
FIG. 11 is a diagrammatic view of a modified block comprising two 6-bit LUTs, according to various embodiments of the invention.

FIG. 11 is a diagrammatic view of a modified block 1100 comprising two LUT6s, according to various embodiments of the invention. The modified block 1100 comprises two modified LUT6s 1105 and 1110. The modified LUT6 1105 comprises the LUT5s 1115 and 1120 and generates the outputs 1135 and 1140, one from each of the LUT5s 1115 and 1120. The modified LUT6 1110 comprises the LUT5s 1125 and 1130 and generates the outputs 1145 and 1150, one from each of the LUT5s 1125 and 1130. The modified block 1100 also acts as a pass-through 1155 for a four-bit IN value, containing a result from a previous row for summing (or containing a zero if the modified block 1100 is in the first row). Thus, the modified block 1100 takes twelve inputs, the same as two traditional LUT6s (five bits of A, three bits of B, and four bits of IN). The actual A and B inputs to the LUT6s 1105 and 1110 are shared instead of duplicated in the inputs to the modified block 1100. As can be seen in FIG. 11, the LUT6 1105 takes A[I-2:I-4] and B[J:J-2] as inputs and the LUT6 1110 takes A[I:I-2] and B[J:J-2] as inputs. Using a traditional block including two LUT6s, the inputs A[I-2] and B[J:J-2] would be duplicated, using six inputs to the traditional two-LUT6 block. By contrast, the modified block 1100 takes each duplicated input only once and routes the incoming signals as shown. This frees up the additional four inputs and allows for pass-through of the IN value without using any additional connections.

The modified LUT6s 1105 and 1110 each take six inputs, like a standard LUT6, but the inputs are connected to the LUT5s differently than in the LUT6 1000. Instead of providing identical input to the two LUT5s and using the sixth input to control a MUX to select the output, only three identical bits are provided to each LUT5. This modification allows each modified LUT6 to function as the LUT5s of two adjacent 1-bit Booth multiplier building blocks 400, and allows the modified block 1100 to function as the LUT5s of an entire 4-bit Booth multiplier building block 600. In some example embodiments, 2-bit Booth multiplier building blocks are used, with each 2-bit Booth multiplier building block using a single modified LUT6 1105 or 1110.

Figure 12:
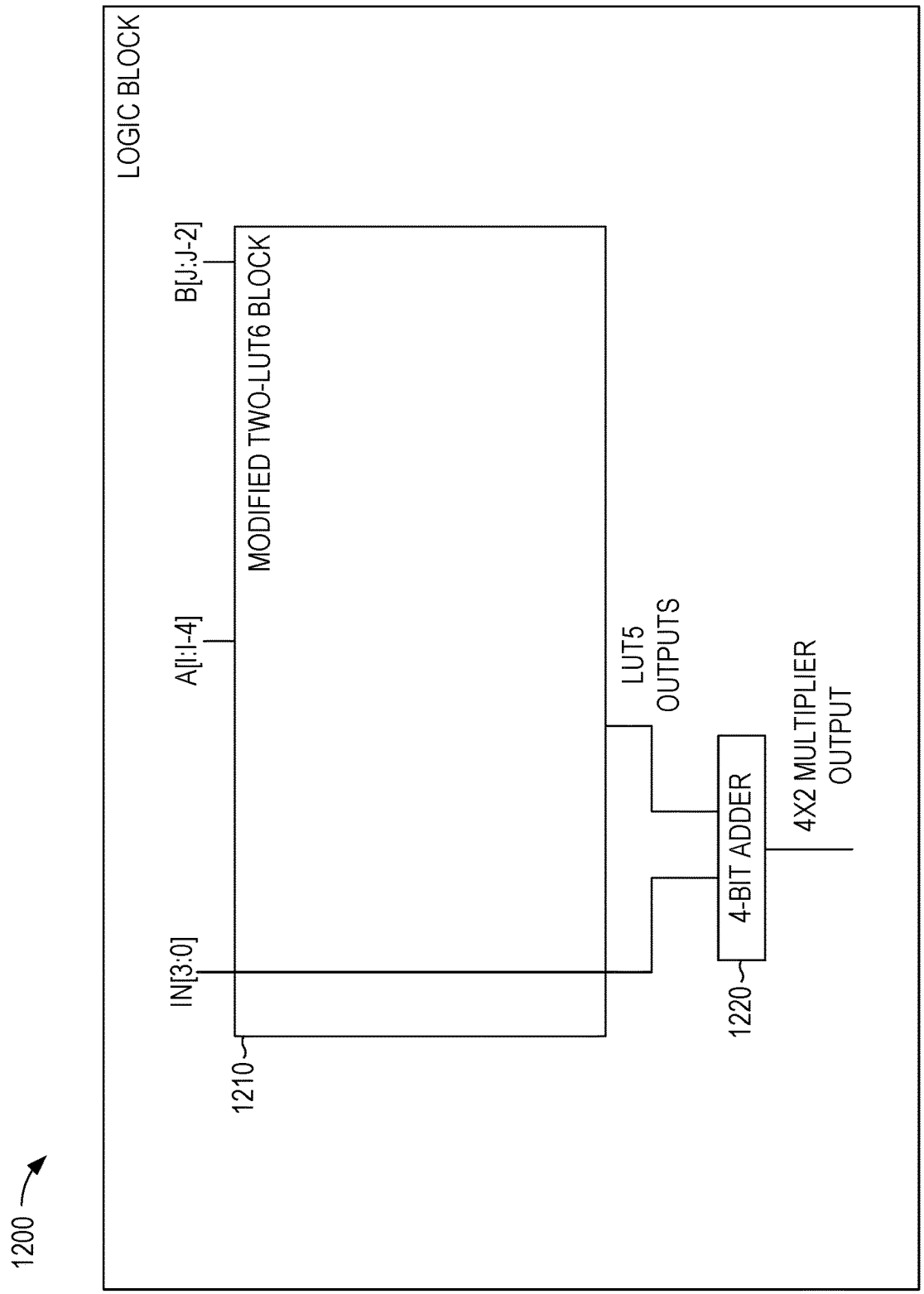
FIG. 12 is a diagrammatic view of a logic block using the modified block to provide a 4-bit by 2-bit multiplier, according to various embodiments of the invention.

FIG. 12 is a diagrammatic view of a logic block 1200 using an instance of the modified block 1100 to provide a 4-bit by 2-bit multiplier, according to various embodiments of the invention. The logic block 1200 includes a modified two-LUTE block 1210, an instance of the modified block 1100, and a four-bit adder 1220. The LUT5 outputs 1135-1150 of the modified block 1100 are added to the four-bit IN value from the previous row to generate a result of the multiplication.

The logic block 1200 allows dramatically improved packing compared with prior art logic blocks when implementing certain functions, such as the modified Booth algorithm with Baugh-Wooley multiplication. This improved packing results in a reduction in logic blocks required, by approximately a factor of two, which further allows higher multiplier-accumulator (MAC) density, lower power consumption, or both. For example, operations per watt may be improved from about 0.5 to about 2.1 trillion operations/watt.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A circuit comprising:
   a building block comprising:
      twelve block inputs; and
      two six-input lookup tables (LUTs), wherein four of the block inputs are provided to each of the two six-input LUTs and four of the twelve block inputs are provided as outputs of the building block without being provided as inputs to either of the two six-input LUTs.

2. The circuit of claim 1, wherein:
   three of the four block inputs that are provided to each of the two six-input LUTs are Booth-encoded bits from a multiplicand.

3. The circuit of claim 1, wherein:
   the building block is a first building block;
   the first building block further comprises:
      an adder that receives a carry input and generates a carry output;
   the circuit further comprises one or more additional building blocks, each additional building block having the same structure as the first building block; and
   the carry input of each additional building block is coupled to the carry output of another additional building block or the carry output of the first building block.

4. The circuit of claim 3, wherein three Booth-encoded bits from a multiplicand are received as inputs to the first building block and each additional building block of the one or more additional building blocks.

5. The circuit of claim 3, wherein:
   the one or more additional building blocks are two additional building blocks comprising a second building block and a third building block; and
   the first building block, the second building block, and the third building block are configured to form an eight-bit Booth multiplier building block that generates an eight-bit product output and a one-bit carry output; wherein the third building block:
   comprises a five-input LUT that generates a one-bit output; and
   uses the one-bit output and the carry output from the second building block to generate the one-bit carry output and one bit of the eight-bit product output.

6. The circuit of claim 5, wherein:
the eight-bit Booth multiplier building block is a first eight-bit Booth multiplier building block;
the circuit further comprises a second eight-bit Booth multiplier building block, a third eight-bit Booth multiplier building block, and a fourth eight-bit Booth multiplier building block;
the second eight-bit Booth multiplier building block receives input comprising:
   six bits of the eight-bit product output from the first eight-bit Booth multiplier building block; and
   the one-bit carry output from the first eight-bit Booth multiplier building block;
the third eight-bit Booth multiplier building block receives input comprising:
   six bits of the eight-bit product output from the second eight-bit Booth multiplier building block; and
   the one-bit carry output from the second eight-bit Booth multiplier building block;
the fourth eight-bit Booth multiplier building block receives input comprising:
   six bits of the eight-bit product output from the third eight-bit Booth multiplier building block; and
   the one-bit carry output from the third eight-bit Booth multiplier building block; and
the circuit generates a multiplication result of an eight-bit multiplier with an eight-bit multiplicand.

7. The circuit of claim 1, wherein the building block is configured to support multiplication of unsigned numbers.

8. The circuit of claim 1, wherein the building block is configured to support multiplication of sign-magnitude numbers.

9. A machine-readable storage medium containing instructions that when executed by a machine, cause the machine to program a field programmable gate array (FPGA) to generate a circuit comprising:
   a building block comprising:
      twelve block inputs; and
      two six-input lookup tables (LUTs), wherein four of the block inputs are provided to each of the two six-input LUTs and four of the twelve block inputs are provided as outputs of the building block without being provided as inputs to either of the two six-input LUTs.

10. The machine-readable storage medium of claim 9, wherein:
   three of the four block inputs that are provided to each of the two six-input LUTs are Booth-encoded bits from a multiplicand.

11. The machine-readable storage medium of claim 9, wherein:
   the building block is a first building block;
   the first building block further comprises:
      an adder that receives a carry input and generates a carry output;
   the circuit further comprises one or more additional building blocks, each additional building block having the same structure as the first building block; and
   the carry input of each additional building block is coupled to the carry output of another additional building block or the carry output of the first building block.

12. The machine-readable storage medium of claim 11, wherein three Booth-encoded bits from a multiplicand are received as inputs to the first building block and each additional building block of the one or more additional building blocks.

13. The machine-readable storage medium of claim 11, wherein:
   the one or more additional building blocks are two additional building blocks comprising a second building block and a third building block; and
   the first building block, the second building block, and the third building block are configured to form an eight-bit Booth multiplier building block that generates an eight-bit product output and a one-bit carry output; wherein the third building block:
      comprises a five-input LUT that generates a one-bit output; and
      uses the one-bit output and the carry output from the second building block to generate the one-bit carry output and one bit of the eight-bit product output.

14. The machine-readable storage medium of claim 13, wherein:
   the eight-bit Booth multiplier building block is a first eight-bit Booth multiplier building block;
   the circuit further comprises a second eight-hit Booth multiplier building block, a third eight-bit Booth multiplier building block, and a fourth eight-bit Booth multiplier building block;
   the second eight-bit Booth multiplier building block receives input comprising:
      six bits of the eight-bit product output from the first eight-bit Booth multiplier building block; and
      the one-bit carry output from the first eight-bit Booth multiplier building block;
   the third eight-hit Booth multiplier building block receives input comprising:
      six bits of the eight-bit product output from the second eight-bit Booth multiplier building block; and
      the one-bit carry output from the second eight-bit Booth multiplier building block;
   the fourth eight-bit Booth multiplier building block receives input comprising:
      six bits of the eight-bit product output from the third eight-bit Booth multiplier building block; and
      the one-bit carry output from the third eight-bit Booth multiplier building block; and
   the circuit generates a multiplication result f an eight-hit multiplier with an eight-bit multiplicand.

15. A system comprising:
   a memory that stores instructions; and
   one or more processors configured by the instructions to perform operations comprising:
      programming a field programmable gate array (FPGA) to generate a circuit comprising:
         a building block comprising:
            twelve block inputs; and
            two six-input lookup tables (LUTs), wherein four of the block inputs are provided to each of the two six-input LUTs and four of the twelve block inputs are provided as outputs of the building block without being provided as inputs to either of the two six-input LUTs.

16. The system of claim 15, wherein:
three of the four block inputs that are provided to each of the two six-input LUTs are Booth-encoded bits from a multiplicand.

17. The system of claim 15, wherein:
the building block is a first building block;
the first building block further comprises:
an adder that receives a carry input and generates a carry output;
the circuit further comprises one or more additional building blocks, each additional building block having the same structure as the first building block; and
the carry input of each additional building block is coupled to the carry output of another additional building block or the carry output of the first building block.

18. The system of claim 17, wherein three Booth-encoded bits from a multiplicand are received as inputs to the first building block and each additional building block of the one or more additional building blocks.

19. The system of claim 17, wherein:
the one or more additional building blocks are two additional building blocks comprising a second building block and a third building block; and
the first building block, the second building block, and the third building block are configured to form an eight-bit Booth multiplier building block that generates an eight-bit product output and a one-bit carry output; wherein the third building block:
comprises a five-input LUT that generates a one-bit output; and
uses the one-bit output and the carry output from the second building block to generate the one-bit carry output and one bit of the eight-bit product output.

20. The system of claim 19, wherein:
the eight-bit Booth multiplier building block is a first eight-hit Booth multiplier building block;
the circuit further comprises a second eight-bit Booth multiplier building block, a third eight-bit Booth multiplier building block, and a fourth eight-bit Booth multiplier building block;
the second eight-bit Booth multiplier building block receives input comprising:
six bits of the eight-bit product output from the first eight-bit Booth multiplier building block; and
the one-bit carry output from the first eight-bit Booth multiplier building block;
the third eight-hit Booth multiplier building block receives input comprising:
six bits of the eight-bit product output from the second eight-bit Booth multiplier building block; and
the one-bit carry output from the second eight-bit Booth multiplier building block;
the fourth eight-bit Booth multiplier building block receives input comprising:
six bits of the eight-bit product output from the third eight-bit Booth multiplier building block; and
the one-bit carry output from the third eight-bit Booth multiplier building block; and
the circuit generates a multiplication result of an eight-bit multiplier with an eight-bit multiplicand.

* * * * *

UNITED STATES PATENT AND TRADEMARK OFFICE
CERTIFICATE OF CORRECTION

PATENT NO. : 10,656,915 B2  
APPLICATION NO. : 16/134576  
DATED : May 19, 2020  
INVENTOR(S) : Pugh et al.

Page 1 of 1

It is certified that error appears in the above-identified patent and that said Letters Patent is hereby corrected as shown below:

In the Claims

In Column 14, Line 29, in Claim 14, delete "eight-hit" and insert --eight-bit-- therefor In Column 14, Line 40, in Claim 14, delete "eight-hit" and insert --eight-bit-- therefor In Column 14, Line 52, in Claim 14, delete "f" and insert --of-- therefor In Column 14, Line 52, in Claim 14, delete "eight-hit" and insert --eight-bit-- therefor In Column 16, Line 6, in Claim 20, delete "eight-hit" and insert --eight-bit-- therefor In Column 16, Line 16, in Claim 20, delete "eight-hit" and insert --eight-bit-- therefor Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*